US006933066B2

(12) United States Patent
Nagaraj et al.

(10) Patent No.: US 6,933,066 B2
(45) Date of Patent: Aug. 23, 2005

(54) THERMAL BARRIER COATING PROTECTED BY TANTALUM OXIDE AND METHOD FOR PREPARING SAME

(75) Inventors: Bangalore Aswatha Nagaraj, West Chester, OH (US); John Frederick Ackerman, Laramie, WY (US); William Randolph Stowell, Rising Sun, IN (US); Ching-Pang Lee, Cincinnati, OH (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 10/317,731

(22) Filed: Dec. 12, 2002

(65) Prior Publication Data

US 2004/0115410 A1 Jun. 17, 2004

(51) Int. Cl.[7] ......................... B32B 15/04; C23C 16/06; F03B 3/12

(52) U.S. Cl. ....................... 428/701; 428/702; 428/697; 428/699; 428/336; 416/241 B; 427/456; 427/576; 427/585; 427/250

(58) Field of Search ................................. 408/336, 701, 408/702, 697, 699, 469; 416/241 B; 427/453, 456, 576, 585, 250

(56) References Cited

U.S. PATENT DOCUMENTS 4,116,723 A 9/1978 Gell et al.
4,741,286 A 5/1988 Itoh et al.
5,015,502 A * 5/1991 Strangman et al.
5,047,612 A 9/1991 Savkar et al.
5,332,598 A 7/1994 Kawasaki et al.
5,399,313 A 3/1995 Ross et al.
5,660,885 A 8/1997 Hasz et al.
5,716,720 A 2/1998 Murphy (Continued)

OTHER PUBLICATIONS

U.S. Appl. No. 10/317,732, filed Dec. 12, 2002, Bangalore Aswatha Nagaraj et al.
U.S. Appl. No. 10/317,730, filed Dec. 12, 2002, Bangalore Aswatha Nagaraj et al.
U.S. Appl. No. 10/317,759, filed Dec. 12, 2002, Bangalore Aswatha Nagaraj et al.
U.S. Appl. No. 10/317,758, filed Dec. 12, 2002, John Frederick Ackerman et al.

*Primary Examiner*—Jennifer McNeil
(74) *Attorney, Agent, or Firm*—Eric W. Guttag; Jagtiani + Guttag; David L. Narciso

(57) ABSTRACT

A thermal barrier coating for an underlying metal substrate of articles that operate at, or are exposed to, high temperatures, as well as being exposed to environmental contaminant compositions. This coating includes an inner layer nearest to the underlying metal substrate comprising a ceramic thermal barrier coating material, as well as an outer layer having an exposed surface and comprising tantalum oxide in an amount sufficient to protect the thermal barrier coating at least partially against environmental contaminants that become deposited on the exposed surface and optionally an intermediate layer between the inner and outer layers comprising alumina. This coating can be used to provide a thermally protected article having a metal substrate and optionally a bond coat layer adjacent to and overlaying the metal substrate. The thermal barrier coating can be prepared by forming the inner layer comprising the ceramic thermal barrier material, optionally forming the intermediate layer comprising the alumina over the inner layer, and then forming the outer layer comprising the tantalum oxide over the intermediate (inner) layer.

24 Claims, 1 Drawing Sheet

U.S. PATENT DOCUMENTS

| | | | | | |
|---|---|---|---|---|---|
| 5,763,107 | A | | 6/1998 | Rickerby et al. | |
| 5,851,678 | A | | 12/1998 | Hasz et al. | |
| 5,856,027 | A | | 1/1999 | Murphy | |
| 5,871,820 | A | | 2/1999 | Hasz et al. | |
| 5,914,189 | A | | 6/1999 | Hasz et al. | |
| 6,025,078 | A | | 2/2000 | Rickersby et al. | |
| 6,060,177 | A | | 5/2000 | Bornstein et al. | |
| 6,117,560 | A | | 9/2000 | Maloney | |
| 6,168,875 | B1 | | 1/2001 | Cybulsky et al. | |
| 6,177,200 | B1 | | 1/2001 | Maloney | |
| 6,210,812 | B1 | | 4/2001 | Hasz et al. | |
| 6,261,643 | B1 | | 7/2001 | Hasz et al. | |
| 6,284,323 | B1 | | 9/2001 | Maloney | |
| 6,296,941 | B1 | | 10/2001 | Eaton, Jr. et al. | |
| 6,319,614 | B1 | | 11/2001 | Beele | |
| 6,333,118 | B1 | | 12/2001 | Alperine et al. | |
| 6,355,356 | B1 | | 3/2002 | Hasz | |
| 6,387,526 | B1 | | 5/2002 | Beele | |
| 6,394,755 | B1 | | 5/2002 | Stowell et al. | |
| 6,413,584 | B1 | | 7/2002 | Wustman et al. | |
| 6,582,834 | B2 | * | 6/2003 | Nagaraj et al. | 428/632 |
| 6,589,677 | B1 | * | 7/2003 | Sun et al. | 428/698 |
| 6,617,036 | B2 | * | 9/2003 | Eaton et al. | 428/446 |
| 6,627,323 | B2 | * | 9/2003 | Nagaraj et al. | 428/469 |

* cited by examiner

THERMAL BARRIER COATING PROTECTED BY TANTALUM OXIDE AND METHOD FOR PREPARING SAME

BACKGROUND OF THE INVENTION

The present invention relates to thermal barrier coatings containing tantalum oxide for protection and mitigation against environmental contaminants, in particular oxides of calcium, magnesium, aluminum, silicon, and mixtures thereof that can become deposited onto such coatings. The present invention further relates to articles with such coatings and a method for preparing such coatings for the article.

Thermal barrier coatings are an important element in current and future gas turbine engine designs, as well as other articles that are expected to operate at or be exposed to high temperatures, and thus cause the thermal barrier coating to be subjected to high surface temperatures. Examples of turbine engine parts and components for which such thermal barrier coatings are desirable include turbine blades and vanes, turbine shrouds, buckets, nozzles, combustion liners and deflectors, and the like. These thermal barrier coatings are deposited onto a metal substrate (or more typically onto a bond coat layer on the metal substrate for better adherence) from which the part or component is formed to reduce heat flow and to limit the operating temperature these parts and components are subjected to. This metal substrate typically comprises a metal alloy such as a nickel, cobalt, and/or iron based alloy (e.g., a high temperature superalloy).

The thermal barrier coating usually comprises a ceramic material, such as a chemically (metal oxide) stabilized zirconia. Examples of such chemically stabilized zirconias include yttria-stabilized zirconia, scandia-stabilized zirconia, calcia-stabilized zirconia, and magnesia-stabilized zirconia. The thermal barrier coating of choice is typically a yttria-stabilized zirconia ceramic coating. A representative yttria-stabilized zirconia thermal barrier coating usually comprises about 7% yttria and about 93% zirconia. The thickness of the thermal barrier coating depends upon the metal substrate part or component it is deposited on, but is usually in the range of from about 3 to about 70 mils (from about 76 to about 1778 microns) thick for high temperature gas turbine engine parts.

Under normal conditions of operation, thermal barrier coated metal substrate turbine engine parts and components can be susceptible to various types of damage, including erosion, oxidation, and attack from environmental contaminants. At the higher temperatures of engine operation, these environmental contaminants can adhere to the heated or hot thermal barrier coating surface and thus cause damage to the thermal barrier coating. For example, these environmental contaminants can form compositions that are liquid or molten at the higher temperatures that gas turbine engines operate at. These molten contaminant compositions can dissolve the thermal barrier coating, or can infiltrate its porous structure, i.e., can infiltrate the pores, channels or other cavities in the coating. Upon cooling, the infiltrated contaminants solidify and reduce the coating strain tolerance, thus initiating and propagating cracks that cause delamination, spalling and loss of the thermal barrier coating material either in whole or in part.

These pores, channel or other cavities that are infiltrated by such molten environmental contaminants can be created by environmental damage, or even the normal wear and tear that results during the operation of the engine. However, this porous structure of pores, channels or other cavities in the thermal barrier coating surface more typically is the result of the processes by which the thermal barrier coating is deposited onto the underlying bond coat layer-metal substrate. For example, thermal barrier coatings that are deposited by (air) plasma spray techniques tend to create a sponge-like porous structure of open pores in at least the surface of the coating. By contrast, thermal barrier coatings that are deposited by physical (e.g., chemical) vapor deposition techniques tend to create a porous structure comprising a series of columnar grooves, crevices or channels in at least the surface of the coating. This porous structure can be important in the ability of these thermal barrier coating to tolerate strains occurring during thermal cycling and to reduce stresses due to the differences between the coefficient of thermal expansion (CTE) of the coating and the CTE of the underlying bond coat layer/substrate.

For turbine engine parts and components having outer thermal barrier coatings with such porous surface structures, environmental contaminant compositions of particular concern are those containing oxides of calcium, magnesium, aluminum, silicon, and mixtures thereof. See, for example, U.S. Pat. No. 5,660,885 (Hasz et al), issued Aug. 26, 1997 which describes these particular types of oxide environmental contaminant compositions. These oxides combine to form contaminant compositions comprising mixed calcium-magnesium-aluminum-silicon-oxide systems (Ca—Mg—Al—SiO) hereafter referred to as "CMAS." During normal engine operations, CMAS can become deposited on the thermal barrier coating surface, and can become liquid or molten at the higher temperatures of normal engine operation. Damage to the thermal barrier coating typically occurs when the molten CMAS infiltrates the porous surface structure of the thermal barrier coating. After infiltration and upon cooling, the molten CMAS solidifies within the porous structure. This solidified CMAS causes stresses to build within the thermal barrier coating, leading to partial or complete delamination and spalling of the coating material, and thus partial or complete loss of the thermal protection provided to the underlying metal substrate of the part or component.

Accordingly, it would be desirable to protect these thermal barrier coatings having a porous surface structure against the adverse effects of such environmental contaminants when used with a metal substrate for a turbine engine part or component, or other article, operated at or exposed to high temperatures. In particular, it would be desirable to be able to protect such thermal barrier coatings from the adverse effects of deposited CMAS.

BRIEF DESCRIPTION OF THE INVENTION

The present invention relates to a thermal barrier coating for an underlying metal substrate of articles that operate at, or are exposed, to high temperatures, as well as being exposed to environmental contaminant compositions, in particular CMAS. This thermal barrier coating comprises:

a. an inner layer nearest to and overlaying the metal substrate and comprising a ceramic thermal barrier coating material in an amount up to 100%;

b. an outer layer adjacent to and overlaying the inner layer and having an exposed surface, and comprising tantalum oxide in an amount up to 100% and sufficient to protect the thermal barrier coating at least partially against environmental contaminants that become deposited on the exposed surface; and c. optionally an intermediate layer comprising alumina in an amount up to 100% between the outer layer and the inner layer.

The present invention also relates to a thermally protected article. This protected articles comprises:

a. a metal substrate;

b. optionally a bond coat layer adjacent to and overlaying the metal substrate; and c. a thermal barrier coating as previously described adjacent to and overlaying the bond coat layer (or overlaying the metal substrate if the bond coat layer is absent).

The present invention further relates to a method for preparing the thermal barrier coating. This method comprises the steps of:

a. forming over the metal substrate an inner layer comprising a ceramic thermal barrier coating material in an amount up to 100%;

b. optionally forming on the inner layer an intermediate layer comprising alumina in an amount up to 100%; and c. forming on the intermediate layer (or the inner layer in the absence of the intermediate layer) an outer layer having an exposed surface and comprising tantalum oxide in an amount up to 100% and sufficient to protect the thermal barrier coating at least partially against environmental contaminants that become deposited on the exposed surface.

The thermal barrier coating of the present invention is provided with at least partial and up to complete protection and mitigation against the adverse effects of environmental contaminant compositions that can deposit on the surface of such coatings during normal turbine engine operation. In particular, the thermal barrier coating of the present invention is provided with at least partial and up to complete protection or mitigation against the adverse effects of CMAS deposits on such coating surfaces. The tantalum oxide present in the outer exposed surface layer of the thermal barrier coating has dielectric properties such that the CMAS deposits are less able (or unable) to adhere to the exposed surface of the outer layer of the thermal barrier coating. As a result, these CMAS deposits are unable to infiltrate the porous surface structure of the thermal barrier coating, and thus cannot cause undesired partial (or complete) delamination and spalling of the coating. The tantalum oxide present in the outer exposed surface layer of the thermal barrier coating can also provide protection against chemical attack of underlying CMAS protection layers such as the optional intermediate layer comprising alumina.

In addition, the thermal barrier coatings of the present invention are provided with protection or mitigation, in whole or in part, against the infiltration of corrosive (e.g., alkali) environmental contaminant deposits. The thermal barrier coatings of the present invention are also useful with worn or damaged coated (or uncoated) metal substrates of turbine engine parts and components so as to provide for these refurbished parts and components protection and mitigation against the adverse effects of such environmental contaminate compositions. In addition to turbine engine parts and components, the thermal barrier coatings of the present invention are useful for metal substrates of other articles that operate at, or are exposed, to high temperatures, as well as to such environmental contaminate compositions.

DETAILED DESCRIPTION OF THE INVENTION

Figure 1:
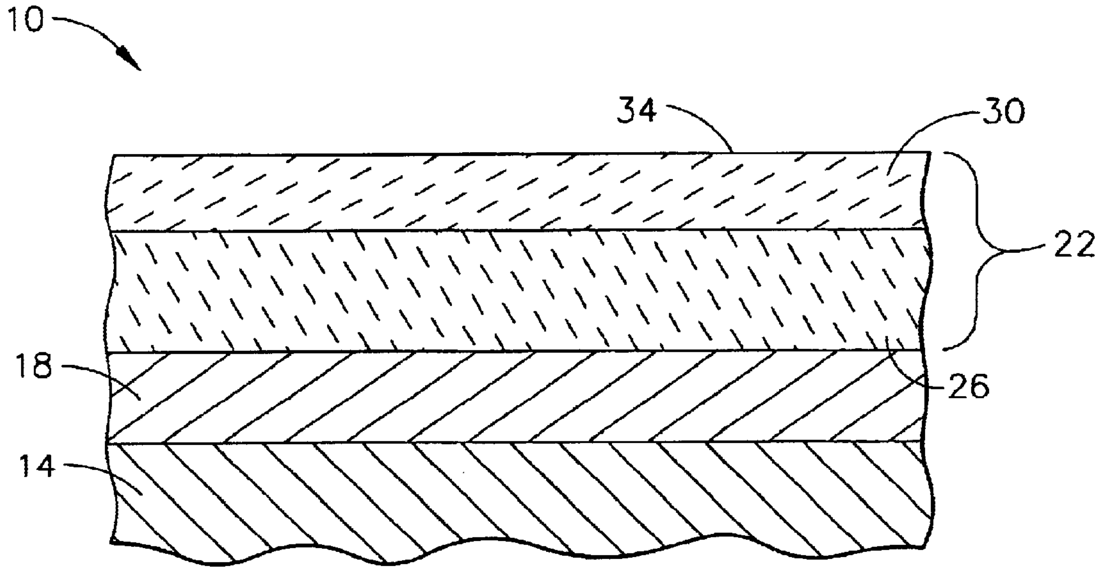
FIG. 1 is a side sectional view of an embodiment of the thermal barrier coating and coated article of the present invention.

As used herein, the term "CMAS" refers environmental contaminant compositions that contain oxides of calcium, magnesium, aluminum, silicon, and mixtures thereof. These oxides typically combine to form compositions comprising calcium-magnesium-aluminum-silicon-oxide systems (Ca—Mg—Al—SiO).

As used herein, the term "tantalum oxide" typically refers to those compounds and compositions comprising $Ta_2O_5$.

As used herein, the terms "alumina" and "aluminum oxide" refer interchangeably to those compounds and compositions comprising $Al_2O_3$, including unhydrated and hydrated forms.

As used herein, the term "ceramic thermal barrier coating material" refers to those coating materials that are capable of reducing heat flow to the underlying metal substrate of the article, i.e., forming a thermal barrier. These materials usually have a melting point of at least about 2000° F. (1093° C.), typically at least about 2200° F. (1204° C.), and more typically in the range of from about 2200° to about 3500° F. (from about 1204° to about 1927° C.). Suitable ceramic thermal barrier coating materials include various zirconias, in particular chemically stabilized zirconias (i.e., various metal oxides such as yttrium oxides blended with zirconia), such as yttria-stabilized zirconias, ceria-stabilized zirconias, calcia-stabilized zirconias, scandia-stabilized zirconias, magnesia-stabilized zirconias, india-stabilized zirconias, ytterbia-stabilized zirconias as well as mixtures of such stabilized zirconias. See, for example, Kirk-Othmer's Encyclopedia of Chemical Technology, 3rd Ed., Vol. 24, pp. 882–883 (1984) for a description of suitable zirconias. Suitable yttria-stabilized zirconias can comprise from about 1 to about 20% yttria (based on the combined weight of yttria and zirconia), and more typically from about 3 to about 10% yttria. These chemically stabilized zirconias can further include one or more of a second metal (e.g., a lanthanide or actinide) oxide such as dysprosia, erbia, europia, gadolinia, neodymia, praseodymia, urania, and hafnia to further reduce thermal conductivity of the thermal barrier coating. See U.S. Pat. No. 6,025,078 (Rickerby et al), issued Feb. 15, 2000 and U.S. Pat. No. 6,333,118 (Alperine et al), issued Dec. 21, 2001, both of which are incorporated by reference. Suitable ceramic thermal barrier coating materials also include pyrochlores of general formula $A_2B_2O_7$ where A is a metal having a valence of 3+ or 2+ (e.g., gadolinium, aluminum, cerium, lanthanum or yttrium) and B is a metal having a valence of 4+ or 5+ (e.g., hafnium, titanium, cerium or zirconium) where the sum of the A and B valences is 7. Representative materials of this type include gadolinium-zirconate, lanthanum titanate, lanthanum zirconate, yttrium zirconate, lanthanum hafnate, cerium zirconate, aluminum cerate, cerium hafnate, aluminum hafnate and lanthanum cerate. See U.S. Pat. No. 6,117,560 (Maloney), issued Sep. 12, 2000; U.S. Pat. No. 6,177,200 (Maloney), issued Jan. 23, 2001; U.S. Pat. No. 6,284,323 (Maloney), issued Sep. 4, 2001; U.S. Pat. No. 6,319,614 (Beele), issued Nov. 20, 2001; and U.S. Pat. No. 6,387,526 (Beele), issued May 14, 2002, all of which are incorporated by reference.

As used herein, the term "comprising" means various compositions, compounds, components, layers, steps and the like can be conjointly employed in the present invention. Accordingly, the term "comprising" encompasses the more restrictive terms "consisting essentially of" and "consisting of."

All amounts, parts, ratios and percentages used herein are by weight unless otherwise specified.

The thermal barrier coatings of the present invention are useful with a wide variety of turbine engine (e.g., gas turbine engine) parts and components that are formed from metal substrates comprising a variety of metals and metal alloys, including superalloys, and are operated at, or exposed to, high temperatures, especially higher temperatures that occur during normal engine operation. These turbine engine parts and components can include turbine airfoils such as blades and vanes, turbine shrouds, turbine nozzles, combustor components such as liners and deflectors, augmentor hardware of gas turbine engines and the like. The thermal barrier coatings of the present invention can also cover a portion or all of the metal substrate. For example, with regard to airfoils such as blades, the thermal barrier coatings of the present invention are typically used to protect, cover or overlay portions of the metal substrate of the airfoil other than solely the tip thereof, e.g., the thermal barrier coatings cover the leading and trailing edges and other surfaces of the airfoil. While the following discussion of the thermal barrier coatings of the present invention will be with reference to metal substrates of turbine engine parts and components, it should also be understood that the thermal barrier coatings of the present invention are useful with metal substrates of other articles that operate at, or are exposed to, high temperatures, as well as being exposed to environmental contaminant compositions, including those the same or similar to CMAS.

The various embodiments of the thermal barrier coatings of the present invention are further illustrated by reference to the drawings as described hereafter. Referring to the drawings, FIG. 1 shows a side sectional view of an embodiment of the thermally barrier coating of the present invention used with the metal substrate of an article indicated generally as 10. As shown in FIG. 1, article 10 has a metal substrate indicated generally as 14. Substrate 14 can comprise any of a variety of metals, or more typically metal alloys, that are typically protected by thermal barrier coatings, including those based on nickel, cobalt and/or iron alloys. For example, substrate 14 can comprise a high temperature, heat-resistant alloy, e.g., a superalloy. Such high temperature alloys are disclosed in various references, such as U.S. Pat. No. 5,399,313 (Ross et al), issued Mar. 21, 1995 and U.S. Pat. No. 4,116,723 (Gell et al), issued Sep. 26, 1978, both of which are incorporated by reference. High temperature alloys are also generally described in Kirk-Othmer's Encyclopedia of Chemical Technology, 3rd Ed., Vol. 12, pp. 417–479 (1980), and Vol. 15, pp. 787–800 (1981). Illustrative high temperature nickel-based alloys are designated by the trade names Inconel®, Nimonic®, Rene® (e.g., Rene® 80-, Rene® 95 alloys), and Udimet®. As described above, the type of substrate 14 can vary widely, but it is representatively in the form of a turbine part or component, such as an airfoil (e.g., blade) or turbine shroud.

As shown in FIG. 1, article 10 also includes a bond coat layer indicated generally as 18 that is adjacent to and overlies substrate 14. Bond coat layer 18 is typically formed from a metallic oxidation-resistant material that protects the underlying substrate 14 and enables the thermal barrier coating indicated generally as 22 to more tenaciously adhere to substrate 14. Suitable materials for bond coat layer 18 include MCrAlY alloy powders, where M represents a metal such as iron, nickel, platinum or cobalt, in particular, various metal aluminides such as nickel aluminide and platinum aluminide. This bond coat layer 18 can be applied, deposited or otherwise formed on substrate 10 by any of a variety of conventional techniques, such as physical vapor deposition (PVD), including electron beam physical vapor deposition (EBPVD), plasma spray, including air plasma spray (APS) and vacuum plasma spray (VPS), or other thermal spray deposition methods such as high velocity oxy-fuel (HVOF) spray, detonation, or wire spray, chemical vapor deposition (CVD), or combinations of such techniques, such as, for example, a combination of plasma spray and CVD techniques. Typically, a plasma spray technique, such as that used for the thermal barrier coating 22, can be employed to deposit bond coat layer 18. Usually, the deposited bond coat layer 18 has a thickness in the range of from about 1 to about 19.5 mils (from about 25 to about 495 microns). For bond coat layers 18 deposited by PVD techniques such as EDPVD, the thickness is more typically in the range of from about 1 about 3 mils (from about 25 to about 76 microns). For bond coat layers deposited by plasma spray techniques such as APS, the thickness is more typically in the range of from about 3 to about 15 mils (from about 76 to about 381 microns).

As shown in FIG. 1, the thermal barrier coating (TBC) 22 is adjacent to and overlies bond coat layer 18. The thickness of TBC 22 is typically in the range of from about 1 to about 100 mils (from about 25 to about 2540 microns) and will depend upon a variety of factors, including the article 10 that is involved. For example, for turbine shrouds, TBC 22 is typically thicker and is usually in the range of from about 30 to about 70 mils (from about 762 to about 1778 microns), more typically from about 40 to about 60 mils (from about 1016 to about 1524 microns). By contrast, in the case of turbine blades, TBC 22 is typically thinner and is usually in the range of from about 1 to about 30 mils (from about 25 to about 762 microns), more typically from about 3 to about 20 mils (from about 76 to about 508 microns).

As shown in FIG. 1, TBC 22 comprises an inner layer 26 that is nearest to substrate 14, and is adjacent to and overlies bond coat layer 18. This inner layer 26 comprises a ceramic thermal barrier coating material in an amount of up to 100%. Typically, inner layer 26 comprises from about 95 to 100% ceramic thermal barrier coating material, and more typically from about 98 to 100% ceramic thermal barrier coating material. The composition of inner layer 26 in terms of the type of ceramic thermal barrier coating materials will depend upon a variety of factors, including the composition of the adjacent bond coat layer 18, the coefficient of thermal expansion (CTE) characteristics desired for TBC 22, the thermal barrier properties desired for TBC 22, and like factors well known to those skilled in the art. The thickness of inner layer 26 will also depend upon a variety of factors, including the overall desired thickness of TBC 22 and the particular article 10 that TBC 22 is used with. Typically, inner layer 26 will comprise from about 80 to about 99%, more typically from about 90 to about 98%, of the thickness of TBC 22.

The TBC further comprises an outer layer indicated generally as 30 that is adjacent to and overlies inner layer 26 and has an exposed surface 34. This outer layer 30 comprises tantalum oxide in amount sufficient to protect TBC 22 at least partially against environmental contaminants that become deposited on the exposed surface 34 and up to 100% of outer layer 30. The tantalum oxide present in outer layer 30 of TBC 22 has dielectric properties such that the CMAS deposits are less able (or unable) to adhere to the exposed surface 34 and are thus unable to infiltrate the porous surface structure of TBC 22. Typically, outer layer 30 comprises from about 95 to 100%, more typically from about 98 to 100%, tantalum oxide. The composition of outer layer 30 in terms of the amount of tantalum oxide will depend upon a variety of factors, including the composition of the adjacent inner layer 26, the CTE characteristics desired for TBC 22, the environmental contaminant protective properties desired, and like factors well know to those skilled in the art.

The thickness of outer layer 30 should be such as to provide protection or mitigation against the adverse effects of environmental contaminant compositions, in particular CMAS, without unduly affecting the mechanical properties of TBC 22, including strain tolerance, modulus and thermal conductivity. In this regard, the outer layer 30 should relatively thin and have a thickness up to about 0.4 mils (about 10 microns). Typically, outer layer 30 will comprise from about 1 to about 20% of the thickness of TBC 22, and more typically from about 2 to about 5% of the thickness of TBC 22.

The composition and thickness of the bond coat layer 18, and the inner layer 26 and outer layer 30 of TBC 22, are typically adjusted to provide appropriate CTEs to minimize thermal stresses between the various layers and the substrate 14 so that the various layers are less prone to separate from substrate 14 or each other. In general, the CTEs of the respective layers typically increase in the direction of outer layer 30 to bond coat layer 18, i.e., outer layer 30 has the lowest CTE, while bond coat layer 18 has the highest CTE.

Figure 2:
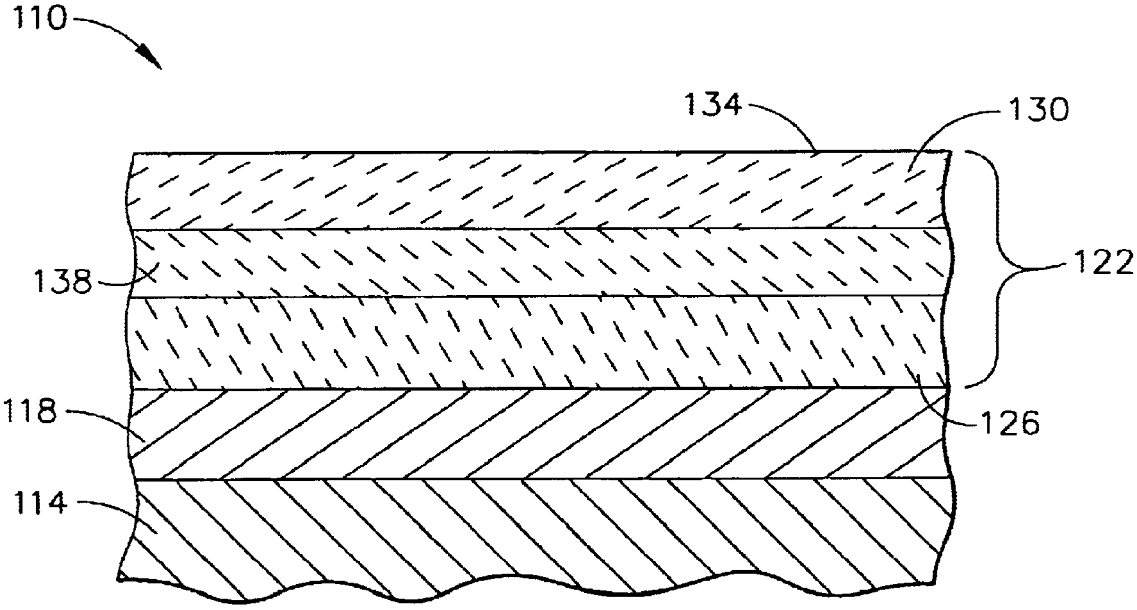
FIG. 2 is a side sectional view of another embodiment of the thermal barrier coating and coated article of the present invention.

FIG. 2 shows a side sectional views of an alternative embodiment of the thermally barrier coating of the present invention used with a metal substrate of an article indicated generally as 110. As shown in FIG. 3, article 110 has a metal substrate indicated generally as 114. (This substrate 114 can comprise any of the metals or metal alloys previously described for substrate 10 of FIG. 1). As shown in FIG. 2, article 110 also includes a bond coat layer indicated generally as 118 that is adjacent to and overlies substrate 114. (The physical characteristics of, composition of and methods for forming this bond coat layer 118 can be any of those previously described for bond coat layer 18 of FIG. 1). As shown in FIG. 2, article 110 further includes a TBC indicated generally as 122 that comprises an inner layer generally indicated as 126 that is adjacent to and overlies bond coat layer 118, and an outer layer generally indicated as 130 that overlies inner layer 126 and has an exposed surface indicated generally as 134.

The physical characteristics and composition of inner layer 126 are the same as those previously described for inner layer 26 of FIG. 1, except that inner layer 126 typically comprises from about 80 to about 98% (more typically from about 90 to about 96%) of the thickness of TBC 122. The physical characteristics and composition of outer layer 130 are the same as those previously described for outer layer 30 of FIG. 1, except that outer layer 130 typically comprises from about 1 to about 10% (more typically from about 2 to about 5%) of the thickness of TBC 122.

As also shown in FIG. 2, TBC 122 further includes an intermediate layer 138 between and adjacent to both inner layer 126 and outer layer 130 that comprises alumina in an amount up to 100%. The alumina present in intermediate layer 138 provides additional protection or mitigation against the adverse effects of CMAS that become deposited on exposed surface 134 by: (1) combining with any CMAS deposits that penetrate or infiltrate outer layer 130; and (2) raising the melting point of such deposits sufficiently so that the deposits do not become molten, or alternatively increases the viscosity of such molten deposits so that they do not flow readily, at higher temperatures. Intermediate layer 138 typically comprises from about 95 to 100%, more typically from about 98 to 100%, alumina. Intermediate layer 138 also typically comprises from about 1 to about 10%, more typically from about 2 to about 5%, of the thickness of TBC 122.

FIG. 3 shows a side sectional views of yet another alternative embodiment of the thermally barrier coating of the present invention used with a metal substrate of an article indicated generally as 210. As shown in FIG. 3, article 210 has a metal substrate indicated generally as 214. (This substrate 214 can comprise any of the metals or metal alloys previously described for substrate 14 of FIG. 1). As shown in FIG. 3, article 210 also includes a bond coat layer indicated generally as 218 that is adjacent to and overlies substrate 214. (The physical characteristics of, composition of and methods for forming this bond coat layer 218 can be any of those previously described for bond coat layer 18 of FIG. 1). As shown in FIG. 3, article 210 further includes a TBC indicated generally as 222 that comprises an inner layer generally indicated as 226 that is adjacent to and overlies bond coat layer 218, and an outer layer generally indicated as 230 that is adjacent to and overlies inner layer 226. The outer layer 230 further comprises a lower layer 234 that is adjacent to and overlies inner layer 226, and an upper surface layer 238 that is adjacent to and overlies lower layer 234 and has an exposed surface 242.

Various types of plasma-spray techniques well known to those skilled in the art can be utilized to apply the thermal barrier coating materials in forming the respective layers of TBCs 22 of the present invention. See, for example, Kirk-Othmer Encyclopedia of Chemical Technology, 3rd Ed., Vol. 15, page 255, and references noted therein, as well as U.S. Pat. No. 5,332,598 (Kawasaki et al), issued Jul. 26, 1994; U.S. Pat. No. 5,047,612 (Savkar et al) issued Sep. 10, 1991; and U.S. Pat. No. 4,741,286 (Itoh et al), issued May 3, 1998 (herein incorporated by reference) which are instructive in regard to various aspects of plasma spraying suitable for use herein. In general, typical plasma spray techniques involve the formation of a high-temperature plasma, which produces a thermal plume. The thermal barrier coating materials, e.g., ceramic powders, are fed into the plume, and the high-velocity plume is directed toward the bond coat layer 18. Various details of such plasma spray coating techniques will be well-known to those skilled in the art, including various relevant steps and process parameters such as cleaning of the bond coat surface 18 prior to deposition; grit blasting to remove oxides and roughen the surface substrate temperatures, plasma spray parameters such as spray distances (gun-to-substrate), selection of the number of spray-passes, powder feed rates, particle velocity, torch power, plasma gas selection, oxidation control to adjust oxide stoichiometry, angle-of-deposition, post-treatment of the applied coating; and the like. Torch power can vary in the range of about 10 kilowatts to about 200 kilowatts, and in preferred embodiments, ranges from about 40 kilowatts to about 60 kilowatts. The velocity of the thermal barrier coating material particles flowing into the plasma plume (or plasma "jet") is another parameter which is usually controlled very closely.

Suitable plasma spray systems are described in, for example, U.S. Pat. No. 5,047,612 (Savkar et al) issued Sep. 10, 1991, which is incorporated by reference. Briefly, a typical plasma spray system includes a plasma gun anode which has a nozzle pointed in the direction of the deposit-surface of the substrate being coated. The plasma gun is often controlled automatically, e.g., by a robotic mechanism, which is capable of moving the gun in various patterns across the substrate surface. The plasma plume extends in an axial direction between the exit of the plasma gun anode and the substrate surface. Some sort of powder injection means is disposed at a predetermined, desired axial location between the anode and the substrate surface. In some embodiments of such systems, the powder injection means is spaced apart in a radial sense from the plasma plume region, and an injector tube for the powder material is situated in a position so that it can direct the powder into the plasma plume at a desired angle. The powder particles, entrained in a carrier gas, are propelled through the injector and into the plasma plume. The particles are then heated in the plasma and propelled toward the substrate. The particles melt, impact on the substrate, and quickly cool to form the thermal barrier coating.

In a similar manner (or by appropriate modification), TBCs 122 of FIG. 2 can be obtained, e.g., by depositing ceramic thermal barrier coating materials on bond coat layer 118 to form inner layer 126, followed by depositing alumina on inner layer 126 to form intermediate layer 138, followed by depositing tantalum oxide on intermediate layer 138 to form outer layer 130. Intermediate layer 138 can be formed by any of the techniques used to form inner layer 26/126 or outer 30/130, including EBVPD and plasma spray techniques.

The method of the present invention is particularly useful in providing protection or mitigation against the adverse effects of such environmental contaminate compositions for TBCs used with metal substrates of newly manufactured articles. However, the method of the present invention is also useful in providing such protection or mitigation against the adverse effects of such environmental contaminate compositions for refurbished worn or damaged TBCs, or in providing TBCs having such protection or mitigation for articles that did not originally have a TBC.

While specific embodiments of the present invention have been described, it will be apparent to those skilled in the art that various modifications thereto can be made without departing from the spirit and scope of the present invention as defined in the appended claims.

What is claimed is:

1. A thermal barrier coating for an underlying metal substrate, which comprises:

a. an inner layer nearest to and overlaying the metal substrate and comprising a ceramic thermal barrier coating material in an amount up to 100%; and b. an outer layer overlaying the inner layer and having an exposed surface, and comprising tantalum oxide in an amount up to 100% and sufficient to protect the thermal barrier coating at least partially against environmental contaminants that become deposited on the exposed surface; and c. an intermediate layer comprising alumina in an amount up to 100% between and adjacent to the inner and outer layers.

2. The coating of claim 1 which has a thickness of from about 1 to about 100 mils and wherein the inner layer comprises from about 80 to about 98% of the thickness of the coating, wherein the intermediate layer comprises from about 1 to about 10% of the thickness of the coating, and wherein the outer layer comprises form about 1 to about 10% of the thickness of the coating.

3. The coating of claim 2 wherein the inner layer comprises from about 90 to about 96% of the thickness of the coating, wherein the intermediate layer comprises from about 2 to about 5% of the thickness of the coating, and wherein the outer layer comprises from about 2 to about 5% of the thickness of the coating.

4. The coating of claim 2 wherein the inner layer comprises from about 95 to 100% of a zirconia and wherein the outer layer comprises from about 95 to 100% tantalum oxide.

5. The coating of claim 4 wherein the inner layer comprises from about 98 to 100% of a yttria-stabilized zirconia and wherein the outer layer comprises from about 98 to 100% tantalum oxide.

6. A thermally protected article, which comprises:

a. a metal substrate; and b. a thermal barrier coating comprising:

i. an inner layer nearest to and overlaying the metal substrate and comprising a ceramic thermal barrier coating material in an amount up to 100%;

ii. an intermediate layer comprising alumina in an amount up to 100% overlaying and adjacent to the inner layer; and iii. an outer layer overlaying and adjacent to the intermediate layer and having an exposed surface, and comprising tantalum oxide in an amount up to 100% and sufficient to protect the thermal barrier coating at least partially against environmental contaminants that become deposited on the exposed surface.

7. The article of claim 6 which further comprises a bond coat layer adjacent to and overlaying the metal substrate and wherein the inner layer is adjacent to and overlies the bond coat layer.

8. The article of claim 7 wherein the thermal barrier coating has a thickness of from about 1 to about 100 mils and wherein the inner layer comprises from about 80 to about 98% of the thickness of the thermal barrier coating, wherein the intermediate layer comprises from about 1 to about 10% of the thickness of the thermal barrier coating, and wherein the outer layer comprises from-about 1 to about 10% of the thickness of the thermal barrier coating.

9. The article of claim 8 wherein the inner layer comprises from about 90 to about 96% of the thickness of the thermal barrier coating and wherein the intermediate layer comprises from about 2 to about 5% of the thickness of the thermal barrier coating, and wherein the outer layer comprises from about 2 to about 5% of the thickness of the thermal barrier coating.

10. The article of claim 8 wherein the inner layer comprises from about 95 to 100% of a zirconia and wherein the outer layer comprises from about 95 to 100% tantalum oxide.

11. The article of claim 10 wherein the inner layer comprises from about 98 to 100% of a yttria-stabilized zirconia and wherein the outer layer comprises from about 98 to 100% tantalum oxide.

12. The article of claim 8 which is a turbine engine component.

13. The component of claim 12 which is a turbine shroud and wherein the thermal barrier coating has a thickness of from about 30 to about 70 mils.

14. The shroud of claim 13 wherein the thermal barrier coating has a thickness of from about 40 to about 60 mils.

15. A method for preparing a thermal barrier coating for an underlying metal substrate, the method comprising the steps of:

a. forming over the metal substrate an inner layer comprising a ceramic thermal barrier coating material in an amount up to 100%;

b. forming over the inner layer an adjacent intermediate layer comprising alumina in an amount up to 100%; and c. forming over the intermediate layer an adjacent outer layer having an exposed surface and comprising tantalum oxide in an amount up to 100% and sufficient to protect the thermal barrier coating at least partially against environmental contaminants that become deposited on the exposed surface.

16. The method of claim 15 wherein a bond coat layer is adjacent to and overlies the metal substrate and wherein the inner layer is formed on the bond coat layer.

17. The method of claim 16 wherein the inner layer is formed by electron beam physical vapor deposition of a zirconia on the bond coat layer.

18. The method of claim 16 wherein the outer layer is formed by plasma spraying tantalum oxide on the intermediate layer.

19. The method of claim 16 wherein the inner layer is formed by plasma spraying of a zirconia on the bond coat layer.

20. A thermal barrier coating for an underlying metal substrate, and which comprises:

a. an inner layer neatest to and overlaying the metal substrate and comprising from about 95 to about 100% of a zirconia, the inner layer further comprising from about 80 to about 98% of the thickness of the coating;

b. an outer layer overlaying the inner layer and comprising from about 95 to 100% tantalum oxide, the outer layer further comprising from about 1 to about 10% of the thickness of the coating; and c. an intermediate layer between and adjacent to the inner and outer layers and comprising from about 95 to 100% alumina, the intermediate layer further comprising from about 1 to about 10% of the thickness of the coating.

21. The coating of claim 20 wherein the intermediate layer comprises from about 98 to 100% alumina, and wherein the inner layer comprises from about 90 to about 96% of the thickness of the coating, the outer layer comprises from about 2 to about 5% of the thickness of the coating and the intermediate layer comprises from about 2 to about 5% of the thickness of the coating.

22. A thermally protected article, which comprises:

a. a metal substrate; and b. a thermal barrier coating overlaying the metal substrate and comprising:

i. an inner layer comprising about 95 to about 100% of a zirconia nearest to and overlaying the metal substrate, the inner layer further comprising from about 80 to about 98% of the thickness of the thermal barrier coating;

ii. an outer layer overlaying the inner layer and having an exposed surface, and comprising from about 95 to 100% tantalum oxide, the outer layer further comprising from about 1 to about 10% of the thickness of the thermal barrier coating; and iii. an intermediate layer comprising from about 95 to 100% alumina between and adjacent to the inner and outer layers, the intermediate layer further comprising from about 1 to about 10% of the thickness of the thermal barrier coating.

23. The article of claim 22 wherein the intermediate layer comprises from about 98 to 100% alumina, and wherein the inner layer comprises from about 90 to about 96% of the thickness of the thermal barrier coating, the outer layer comprises from about 2 to about 5% of the thickness of the thermal barrier coating and the intermediate layer comprises from about 2 to about 5% of the thickness of the thermal barrier coating.

24. A method for preparing a thermal barrier coaxing on a bond coat layer adjacent to and overlaying a metal substrate, the method comprising the steps of:

a. forming over the bond coat layer an inner layer comprising a ceramic thermal barrier coating material in an amount up to 100%;

b. forming over the inner layer an adjacent intermediate layer comprising from about 95 to 100% alumina; and c. forming over the intermediate layer an outer layer having an exposed surface and comprising tantalum oxide in an amount up to 100% and sufficient to protect the thermal barrier coating at least partially against environmental contaminants that become deposited on the exposed surface.

* * * * *